United States Patent
Lee et al.

(10) Patent No.: US 10,348,255 B1
(45) Date of Patent: Jul. 9, 2019

(54) WIDEBAND TRANSIMPEDANCE AMPLIFIER CIRCUIT

(71) Applicant: Industrial Technology Research Institute, Hsinchu (TW)

(72) Inventors: Tai-Hsing Lee, Hsinchu (TW); Tsai-Kan Chien, Yunlin County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/872,911

(22) Filed: Jan. 16, 2018

(30) Foreign Application Priority Data

Dec. 14, 2017 (TW) .............................. 106143937 A

(51) Int. Cl.
| | | |
|---|---|---|
| H03F 3/16 | (2006.01) | |
| H03F 3/08 | (2006.01) | |
| H03G 3/30 | (2006.01) | |
| H03F 3/45 | (2006.01) | |

(52) U.S. Cl.
CPC .............. H03F 3/082 (2013.01); H03F 3/087 (2013.01); H03F 3/45183 (2013.01); H03G 3/3084 (2013.01)

(58) Field of Classification Search
CPC .................................... H03F 3/16; H03F 1/30
USPC ................................................. 330/277, 296
See application file for complete search history.

(56) References Cited

U.S. PATENT DOCUMENTS

| | | | |
|---|---|---|---|
| 4,939,475 A * | 7/1990 | Prasse ..................... | H03F 3/082 250/214 A |
| 6,218,905 B1 | 4/2001 | Sanders et al. | |
| 6,275,114 B1 | 8/2001 | Tanji et al. | |
| 6,359,517 B1 | 3/2002 | Coleco | |
| 6,587,003 B2 * | 7/2003 | Jordanov ................ | H03F 3/082 250/214 A |
| 6,806,777 B2 | 10/2004 | Franca-Neto | |
| 6,862,322 B1 | 3/2005 | Ewen et al. | |
| 7,042,295 B2 * | 5/2006 | Guckenberger .......... | H03F 3/08 250/214 A |

(Continued)

FOREIGN PATENT DOCUMENTS

| | | |
|---|---|---|
| JP | 4886725 B2 | 2/2012 |
| TW | 560180 | 11/2003 |

(Continued)

OTHER PUBLICATIONS

Abu-Taha et al., "Broadand transipedance amplifier TIA in CMOS 0.18?m technology using matching technique," 2015 9th International Conference on Electrical and Electronics Engineering (ELECO), Nov. 2015, pp. 1-4, IEEE, US.

(Continued)

Primary Examiner — Henry Choe

(57) ABSTRACT

A wideband transimpedance amplifier circuit is provided. The wideband transimpedance amplifier circuit includes a common-gate transistor, a bias current controlling circuit and an amplifier circuit. The bias current controlling circuit is coupled to a source of the common-gate transistor. The amplifier circuit is coupled to a drain of the common-gate transistor. The bias current controlling circuit adjusts the input impedance of the wideband transimpedance amplifier circuit according to the output signal of the amplifier circuit.

14 Claims, 4 Drawing Sheets

(56) References Cited

U.S. PATENT DOCUMENTS

| | | | | |
|---|---|---|---|---|
| 7,362,175 B2* | 4/2008 | Arques | ................ | H03F 1/0205 |
| | | | | 330/264 |
| 9,035,697 B2* | 5/2015 | Youssef | ................... | H03F 3/68 |
| | | | | 330/311 |
| 2008/0284522 A1* | 11/2008 | Denoyer | ................... | H03F 3/08 |
| | | | | 330/308 |
| 2015/0145597 A1 | 5/2015 | Huang et al. | | |

FOREIGN PATENT DOCUMENTS

| | | |
|---|---|---|
| TW | 200726070 | 7/2007 |
| TW | 200921663 | 5/2009 |
| TW | I420806 | 12/2013 |
| TW | 201421926 | 6/2014 |
| TW | 201519545 | 5/2015 |

OTHER PUBLICATIONS

Jung et al., "A Design Methodology to Achieve Low Input mpedance and Non-Constant Gain-BandwidthProduct in TIAs for Optical Communication," May 2013, pp. 598-201, IEEE, US.

Taiwan Patent Office, Office Action, U.S. Appl. No. 106143937, dated Jul. 25, 2018, Taiwan.

\* cited by examiner

US 10,348,255 B1

WIDEBAND TRANSIMPEDANCE AMPLIFIER CIRCUIT

CROSS REFERENCE TO RELATED APPLICATIONS

This Application claims priority of Taiwan Patent Application No. 106143937 filed on Dec. 14, 2017, the entirety of which is incorporated by reference herein.

BACKGROUND

Field of the Disclosure

The disclosure generally relates to an amplifier circuit, and relates to a wideband transimpedance amplifier (TIA) circuit.

Description of the Related Art

In a conventional photoreceiver circuit, a wideband transimpedance amplifier may be configured in the photoreceiver circuit to transform the current signals to the voltage signals. Specifically, when the photoreceiver circuit receives an optical signal, the optical signal will be transformed to the current signal first, and then the current signal will be transmitted to the wideband transimpedance amplifier. When the wideband transimpedance amplifier receives the current signal, the wideband transimpedance amplifier will transform the current signal to the voltage signal and amplify the amplitude of the voltage signal.

For the design of the input impedance of the conventional wideband transimpedance amplifier, the input impedance is usually realized by configuring a feedback resistor or cascading an inductor. However, for the scheme for configuring the feedback resistor, more thermal noise may be generated. For the scheme for cascading the inductor, the quality factor may be worse and the size of the wideband transimpedance amplifier may be larger.

SUMMARY

An embodiment of the disclosure provides a wideband transimpedance amplifier circuit. The wideband transimpedance amplifier circuit comprises a common-gate transistor, a bias current controlling circuit and an amplifier circuit. The bias current controlling circuit is coupled to a source of the common-gate transistor. The amplifier circuit is coupled to a drain of the common-gate transistor. The bias current controlling circuit adjusts the input impedance of the wideband transimpedance amplifier circuit according to the output signal of the amplifier circuit.

In an embodiment, the bias current controlling circuit comprises a bias voltage transistor and a bias voltage adjusting circuit. In an embodiment, the bias voltage adjusting circuit comprises a compactor. The compactor compares the output signal of the amplifier circuit with a reference signal to generate an adjusting signal. In an embodiment, the bias voltage transistor is coupled to the source of the common-gate transistor and a gate bias of the bias voltage transistor is adjusted according to the adjusting signal. When the gate bias of the bias voltage transistor has been adjusted, the bias current of the common-gate transistor is changed to adjust the input impedance.

Other aspects and features of the disclosure will become apparent to those with ordinary skill in the art upon review of the following descriptions of specific embodiments of the wideband transimpedance amplifier circuit.

BRIEF DESCRIPTION OF THE DRAWINGS

The disclosure will become more fully understood by referring to the following detailed description with reference to the accompanying drawings, wherein.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
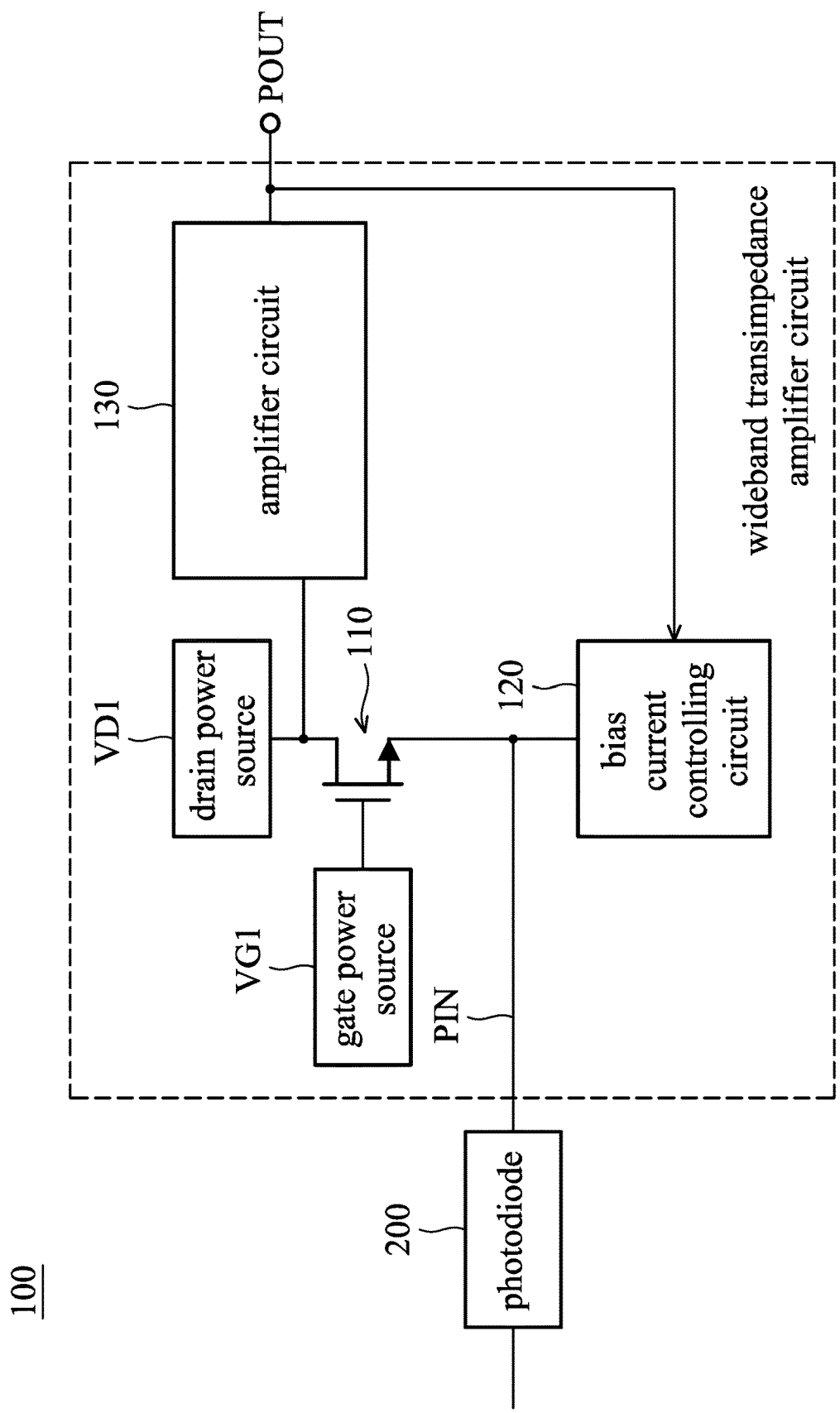
FIG. 1 is a block diagram of a wideband transimpedance amplifier circuit according to an embodiment of the disclosure.

FIG. 1 is a block diagram of a wideband transimpedance amplifier circuit according to an embodiment of the disclosure. The wideband transimpedance amplifier circuit 100 may be applied in a photoreceiver or a radio frequency (RF) wideband amplifier, but the disclosure should not be limited thereto. In the embodiments of the disclosure, the wideband transimpedance amplifier circuit 100 is applied in a photoreceiver for description. As shown in FIG. 1, the wideband transimpedance amplifier circuit 100 may comprise a common-gate transistor 110, a bias current controlling circuit 120 and an amplifier circuit 130. In order to clarify the concept of the disclosure, FIG. 1 presents a simplified block diagram in which the elements relevant to the disclosure are shown. However, the disclosure should not be limited to what is shown in FIG. 1. The wideband transimpedance amplifier circuit 100 may also comprise other elements.

As shown in FIG. 1, the bias current controlling circuit 120 is coupled to the source of the common-gate transistor 110, and the amplifier circuit 130 is coupled to the drain of the common-gate transistor 110. The drain of the common-gate transistor 110 is coupled of a drain power source VD1 and the gate of the common-gate transistor 110 is coupled of a gate power source VG1. In addition, a photodiode 200 is coupled to the source of the common-gate transistor 110 and to the bias current controlling circuit 120. The photodiode 200 may transform a received optical signal to a current signal and then transmit the current signal to the output end PIN of the wideband transimpedance amplifier circuit 100.

In an embodiment, the common-gate transistor 110 is configured to transform the current signal from the photodiode 200 to a voltage signal. The common-gate transistor 110 can be taken as an input impedance of the wideband transimpedance amplifier circuit 100. The input impedance may be adaptively adjusted according to the size and operating current of the common-gate transistor 110.

In an embodiment, the bias current controlling circuit 120 generates an adjusting signal according to the output signal of the amplifier circuit 130. The adjusting signal may be used to adjust the bias current of the common-gate transistor 110 to change the input impedance, as a result, the input impedance can match the photodiode 200 to increase the efficiency of the signal transmission. The details will be illustrated below.

Figure 2:
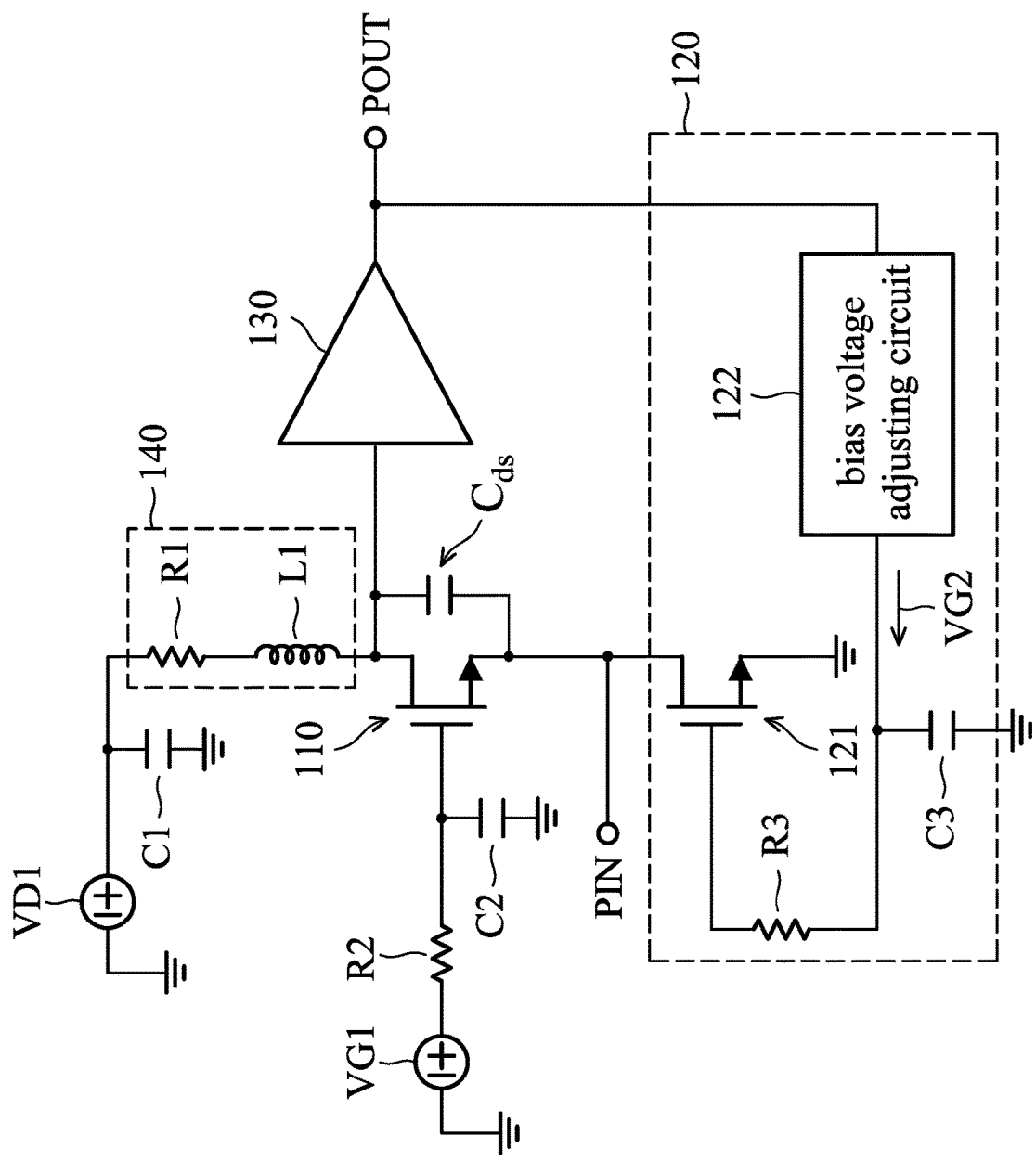
FIG. 2 is a circuit diagram of a wideband transimpedance amplifier circuit according to an embodiment of the disclosure.

FIG. 2 is a circuit diagram of a wideband transimpedance amplifier circuit according to an embodiment of the disclosure. The circuit diagram of FIG. 2 is for illustrating the embodiments of the disclosure, but the disclosure should not be limited to what is shown in FIG. 2.

As shown in FIG. 2, the wideband transimpedance amplifier circuit 100 may further comprise a resistor R2 and capacitors C1 and C2. The drain power source VD1 may be coupled to a ground and the capacitor C1, and the gate power source VG1 may be coupled to a ground and the resistor R2. The resistor R2 may be coupled to the gate of the common-gate transistor 110 and connected to the capacitor C2 in series. Further, the capacitor C2 may be coupled to a ground.

As shown in FIG. 2, the bias current controlling circuit 120 of the wideband transimpedance amplifier circuit 100 may comprise a bias voltage transistor 121, a bias voltage adjusting circuit 122, a resistor R3 and a capacitor C3. The gate of the bias voltage transistor 121 may be coupled to the bias voltage adjusting circuit 122. The resistor R3 may be coupled to the gate of the bias voltage transistor 121, and connected to the capacitor C3 in series. The resistor R3 may be further coupled to the bias voltage adjusting circuit 122 and a ground. In addition, in the embodiment of the disclosure, the wideband transimpedance amplifier circuit 100 further comprises a shunt-peaking adjusting circuit 140 and the shunt-peaking adjusting circuit 140 is coupled to the drain of the common-gate transistor 110.

Figure 3:
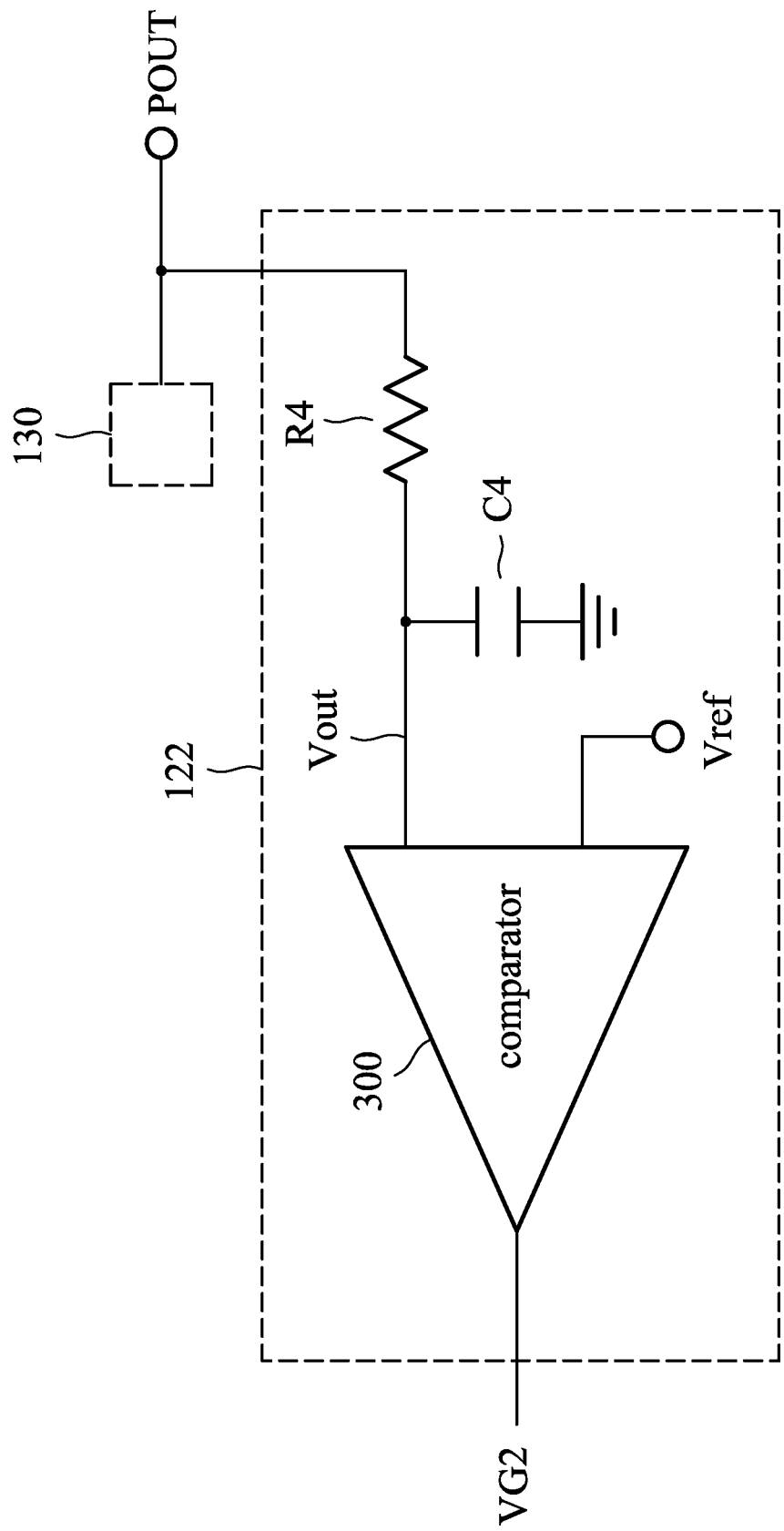
FIG. 3 is a circuit diagram of a bias voltage adjusting circuit according to an embodiment of the invention.

In an embodiment of the disclosure, the bias voltage adjusting circuit 122 generates a adjusting signal according to the output signal outputted from the output end POUT of the wideband transimpedance amplifier circuit 100 (or from the amplifier circuit 130), and transmits the adjusting signal to the gate of the bias voltage transistor 121 to adjust the gate bias of the bias voltage transistor 121. When the gate bias of the bias voltage transistor 121 has been adjusted, the bias current of the common-gate transistor 110 will be changed accordingly, as a result, the input impedance will be changed. Therefore, when the input impedance does not match the photodiode 200 (e.g. the type of the photodiode 200 is different from the type of the original photodiode, or the operating frequency of the photodiode 200 is different from the operating frequency of the original photodiode), the adjusted input impedance will match the photodiode 200. FIG. 3 will be taken as an example for description below.

FIG. 3 is a circuit diagram of a bias voltage adjusting circuit according to an embodiment of the disclosure. The circuit diagram of FIG. 3 is for illustrating the embodiments of the disclosure, but the disclosure should not be limited to what is shown in FIG. 3.

As shown in FIG. 3, the bias voltage adjusting circuit 122 may comprise a comparator 300, a resistor R4 and a capacitor C4. The resistor R4 may be coupled to a input end of the comparator 300 and to the output end POUT of the wideband transimpedance amplifier circuit 100, and connected to the capacitor C4 in series. The capacitor C4 further may be coupled to a ground. One input end of the comparator 300 may receive the output signal (i.e. the output voltage Vout) outputted by the output end of the amplifier circuit 130 and the other input end of the comparator 300 may receive a reference signal (i.e. the reference voltage Vref). Then, the comparator 300 may compare the output signal outputted by the output end of the amplifier circuit 130 with the reference signal to generate an adjusting signal (i.e. adjusting voltage VG2) and transmit the adjusting signal to the bias voltage transistor 121.

For example, when the input impedance does not match the photodiode 200, the output end of the amplifier circuit 130 may decrease, as a result, the output voltage Vout may decrease. Therefore, when the comparator 300 compares the output voltage Vout with the reference voltage Vref, the comparator 300 may increase the adjusting voltage VG2. When the gate of the bias voltage transistor 121 has received the adjusted adjusting voltage VG2, the gate bias of the bias voltage transistor 121 will be changed. When the gate bias of the bias voltage transistor 121 has been changed, the bias current of the common-gate transistor 110 will be changed accordingly to make the input impedance be able to be changed adaptively. Therefore, the adjusted input impedance may match the photodiode 200.

Back to FIG. 2, in an embodiment, the shunt-peaking adjusting circuit 140 may comprise a cascade of a resistor R1 and an inductor L1. The shunt-peaking adjusting circuit 140 may compensate the effect of the parasitic capacitor $C_{ds}$ between the drain and the source of the common-gate transistor 110 to increase the operating bandwidth of the wideband transimpedance amplifier circuit 100.

Figure 4:
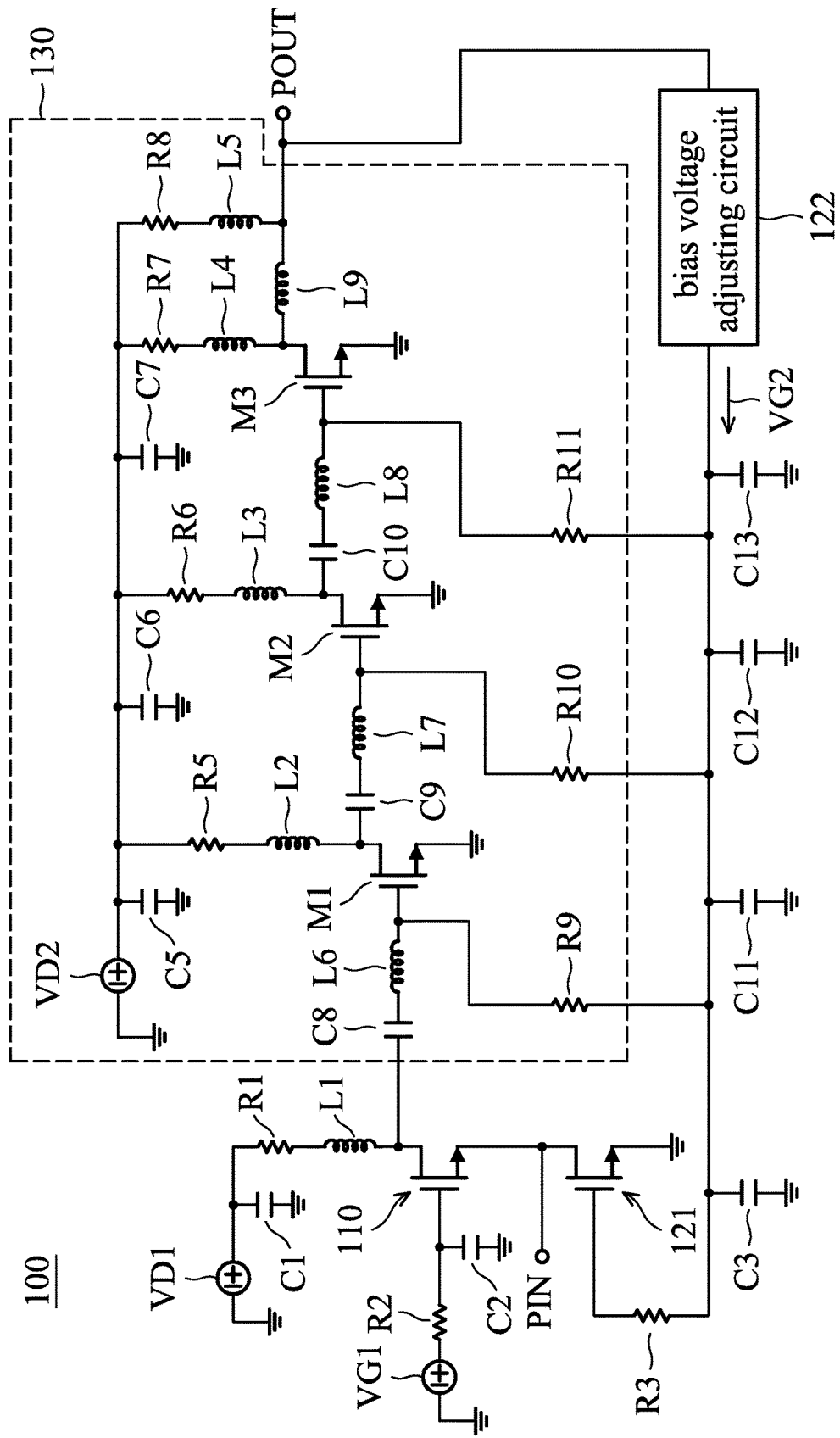
FIG. 4 is a circuit diagram of an amplifier circuit according to an embodiment of the invention.

In an embodiment, the amplifier circuit 130 may be configured to amplify the signal inputted by the common-gate transistor 110. In an embodiment, the amplifier circuit 130 may be a multi-stage amplifier circuit. FIG. 4 is a circuit diagram of an amplifier circuit according to an embodiment of the disclosure. As shown in FIG. 4, the amplifier circuit 130 is a four-stage amplifier circuit, but the disclosure should not be limited thereto. The amplifier circuit 130 comprises transistors M1, M2 and M3, resistors R5, R6, R7, R8, R9, R10 and R11, the capacitors C5, C6, C7, C8, C9 and C10, and the inductors L2, L3, L4, L5, L6, L7, L8 and L9. A drain voltage VD2 may be coupled to the drains of the transistors M1, M2 and M3. The capacitors C5, C6 and C7 are coupled to the drain voltage VD1 and a ground. The resistor R5 may be connected to the inductor L2 in series and is coupled to the drain of the transistor M1. The resistor R6 may be connected to the inductor L3 in series and is coupled to the drain of the transistor M2. The resistor R7 may be connected to the inductor L4 in series and is coupled to the drain of the transistor M3. The resistor R8 may be connected to the inductor L5 in series and is coupled to the output end POUT of the wideband transimpedance amplifier circuit 100.

The gate of the transistor M1 may be coupled to the drain of the common-gate transistor 110 through the series-wound capacitor C8 and inductor L6. The drain of the transistor M1 may be coupled to the gate of the transistor M2 through the series-wound capacitor C9 and inductor L7. The drain of the transistor M2 may be coupled to the gate of the transistor M3 through the series-wound capacitor C10 and inductor L8. The drain of the transistor M3 may be coupled to the output end POUT of the wideband transimpedance amplifier circuit 100 through the inductor L9. The sources of the transistors M1, M2 and M3 are coupled to a ground. In addition, the amplifier circuit 130 as shown in FIG. 4 may be coupled to the bias current controlling circuit 120 through the resistors R9, R10 and R11. The resistors R9, R10 and R11 may be respectively connected to the capacitors C11, C12 and C13 in series and coupled to a ground through the capacitors C11, C12 and C13.

In the embodiments of the disclosure, the common-gate transistor 110 can be taken as an input impedance and the bias current controlling circuit 120 can change the bias current of the common-gate transistor 110 according to the output signal generated by the wideband transimpedance amplifier circuit 100 according to the current signal inputted by the photodiode to adjust the input impedance adaptively. Therefore, even if the wideband transimpedance amplifier circuit 100 is coupled to different types of photodiodes or the wideband transimpedance amplifier circuit 100 is operated in different frequencies, the adjusted input impedance can match the photodiode. In addition, comparing to conventional design of the wideband transimpedance amplifier circuit, the common-gate transistor 110 is taken as an input impedance in the wideband transimpedance amplifier circuit 100 provided in the disclosure, as a result, the required size for the manufacturing process of the wideband transimpedance amplifier circuit 100 will be reduced.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

The wideband transimpedance amplifier circuit of the disclosure has a common-gate transistor is taken as an input impedance and the input impedance is adjusted adaptively.

Reference throughout this specification to "one embodiment" or "an embodiment" means that a particular feature, structure, or characteristic described in connection with the embodiment is included in at least one embodiment of the disclosure, but does not denote that they are present in every embodiment. Thus, the appearance of the phrases "in one embodiment" or "in an embodiment" in various places throughout this specification are not necessarily referring to the same embodiment of the disclosure.

The above paragraphs describe many aspects of the disclosure. Obviously, the teaching of the disclosure can be accomplished by many methods, and any specific configurations or functions in the disclosed embodiments present a representative condition. Those who are skilled in this technology will understand that all of the disclosed aspects in the disclosure can be applied independently or be incorporated.

While the disclosure has been described by way of example and in terms of preferred embodiment, it is to be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A wideband transimpedance amplifier circuit, comprising:
   a common-gate transistor;
   a bias current controlling circuit, coupled to a source of the common-gate transistor;
   an amplifier circuit, coupled to a drain of the common-gate transistor; and
   a shunt-peaking adjusting circuit, coupled to the drain of the common-gate transistor,
   wherein the bias current controlling circuit adjusts an input impedance of the wideband transimpedance amplifier circuit according to an output signal of the amplifier circuit, and
   wherein the shunt-peaking adjusting circuit comprises a cascade of a first resistor and a first inductor.

2. The wideband transimpedance amplifier circuit of claim 1, wherein the common-gate transistor transforms a current signal from a photodiode to a voltage signal.

3. A wideband transimpedance amplifier circuit, comprising:
   a common-gate transistor;
   a bias current controlling circuit, coupled to a source of the common-gate transistor;
   an amplifier circuit, coupled to a drain of the common-gate transistor,
   wherein the bias current controlling circuit adjusts an input impedance of the wideband transimpedance amplifier circuit according to an output signal of the amplifier circuit,
   wherein the bias current controlling circuit comprises a bias voltage transistor and a bias voltage adjusting circuit, and a gate of the bias voltage transistor is coupled to the bias voltage adjusting circuit, and
   wherein the bias current controlling circuit further comprises a second resistor and a first capacitor, and the second resistor is coupled to the gate of the bias voltage transistor and connected to the first capacitor in series.

4. The wideband transimpedance amplifier circuit of claim 3, wherein the bias voltage adjusting circuit comprises a compactor and the compactor compares the output signal of the amplifier circuit with a reference signal to generate an adjusting signal.

5. The wideband transimpedance amplifier circuit of claim 4, wherein the bias voltage adjusting circuit further comprises a third resistor and a second capacitor, and the third resistor is coupled to an output end of the wideband transimpedance amplifier circuit and is connected the second capacitor in series.

6. The wideband transimpedance amplifier circuit of claim 4, wherein the bias voltage transistor is coupled to the source of the common-gate transistor and a gate bias of the bias voltage transistor is adjusted according to the adjusting signal.

7. The wideband transimpedance amplifier circuit of claim 6, wherein when the gate bias of the bias voltage transistor has been adjusted, a bias current of the common-gate transistor is changed to adjust the input impedance.

8. The wideband transimpedance amplifier circuit of claim 1, wherein the amplifier circuit is a multi-stage amplifier circuit, and the multi-stage amplifier circuit is coupled to the bias current controlling circuit.

9. The wideband transimpedance amplifier circuit of claim 1, wherein the bias current controlling circuit comprises a bias voltage transistor and a bias voltage adjusting circuit, and a gate of the bias voltage transistor is coupled to the bias voltage adjusting circuit.

10. The wideband transimpedance amplifier circuit of claim 9, wherein the bias current controlling circuit further comprises a second resistor and a first capacitor, and the second resistor is coupled to the gate of the bias voltage transistor and connected to the first capacitor in series.

11. The wideband transimpedance amplifier circuit of claim 10, wherein the bias voltage adjusting circuit comprises a compactor and the compactor compares the output signal of the amplifier circuit with a reference signal to generate an adjusting signal.

12. The wideband transimpedance amplifier circuit of claim 11, wherein the bias voltage adjusting circuit further comprises a third resistor and a second capacitor, and the third resistor is coupled to an output end of the wideband transimpedance amplifier circuit and is connected the second capacitor in series.

13. The wideband transimpedance amplifier circuit of claim 11, wherein the bias voltage transistor is coupled to the source of the common-gate transistor and a gate bias of the bias voltage transistor is adjusted according to the adjusting signal.

14. The wideband transimpedance amplifier circuit of claim 13, wherein when the gate bias of the bias voltage transistor has been adjusted, a bias current of the common-gate transistor is changed to adjust the input impedance.

* * * * *